United States Patent [19]
Kimura

[11] Patent Number: 5,247,196
[45] Date of Patent: Sep. 21, 1993

[54] SEMICONDUCTOR MEMORY DEVICE INCLUDING CAPACITOR HAVING STACKED STRUCTURE AND MANUFACTURING METHOD THEREOF

[75] Inventor: Mikohiro Kimura, Hyogo, Japan

[73] Assignee: Mitsubishi Denki Kabushiki Kaisha, Tokyo, Japan

[21] Appl. No.: 669,130

[22] Filed: Mar. 13, 1991

[30] Foreign Application Priority Data

Mar. 30, 1990 [JP] Japan .................................. 2-86272

[51] Int. Cl.[5] ..................... H01L 29/68; H01L 29/78; H01L 29/92
[52] U.S. Cl. .................................... 257/303; 257/305; 257/306; 257/307; 257/308
[58] Field of Search ............... 257/296, 301, 303, 305, 257/306, 307, 308, 908, 909, 911

[56] References Cited

U.S. PATENT DOCUMENTS

| | | | |
|---|---|---|---|
| 4,899,203 | 2/1990 | Ino | 357/23.6 |
| 4,985,718 | 1/1991 | Ishijima | 257/296 |
| 5,005,103 | 4/1991 | Know et al. | 257/296 |
| 5,095,346 | 3/1992 | Bae et al. | 257/306 |
| 5,177,574 | 1/1993 | Yoneda | 257/306 |

FOREIGN PATENT DOCUMENTS 0398569 5/1990 European Pat. Off. .

OTHER PUBLICATIONS

Ema et al., "3-Dimensional Stacked Capacitor Cell for 16M and 64M DRAMs", IEEE IDEM 1988, pp. 592-595.

Kimura et al., "A New Stacked Capacitor DRAM Cell Characterized by a Storage Capacitor on a Bit-Line Structure", IEEE IDEM 1988, pp. 596-599.

Primary Examiner—Andrew J. James
Assistant Examiner—Ngan Van Ngo
Attorney, Agent, or Firm—Lowe, Price, LeBlanc & Becker

[57] ABSTRACT

A dynamic random access memory includes a first conductivity type semiconductor substrate (40), a plurality of word lines (1a, 1b, 1c, 1d), a plurality of bit lines (2a, 2b) and a plurality of memory cells (3). The memory cells (3) are provided at the intersections between the word lines (1a, 1b, 1c, 1d) and the bit lines (2a, 2b). Each of the memory cells (3) includes a pair of impurity regions (6a, 6b) of a second conductivity type, a gate electrode (8) connected to the word line (1a, 1b, 1c, 1d), a storage node (9) and a cell plate (11). A capacitor (5) including the storage node (9) and the cell plate (11) is located above the bit lines (2a, 2b). The storage node (9) is formed to extend from a bottom surface to a side surface of a hole (Ct1, Ct2) formed in an insulator layer (14a, 14b) so as to extend to a surface of one impurity region (6a). The cell plate (11) is formed to interpose the storage node (9) between two layers thereof along the bottom surface and the side surface of the hole (Ct1, Ct2). This enables an increase in capacitance of a capacitor. Combinations of simple manufacture processes facilitate the manufacture of the capacitor of a stacked structure having increased capacitance with respect to mass production.

12 Claims, 10 Drawing Sheets

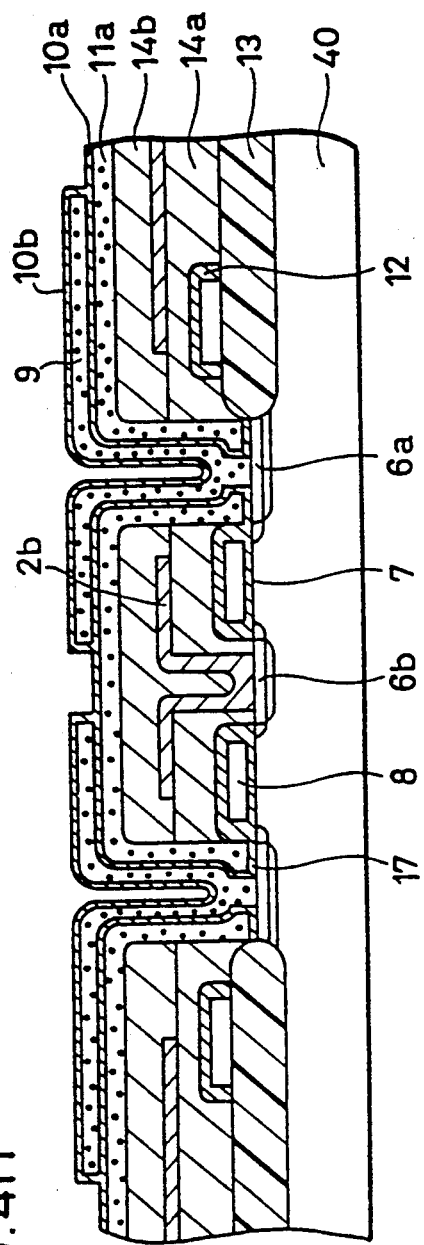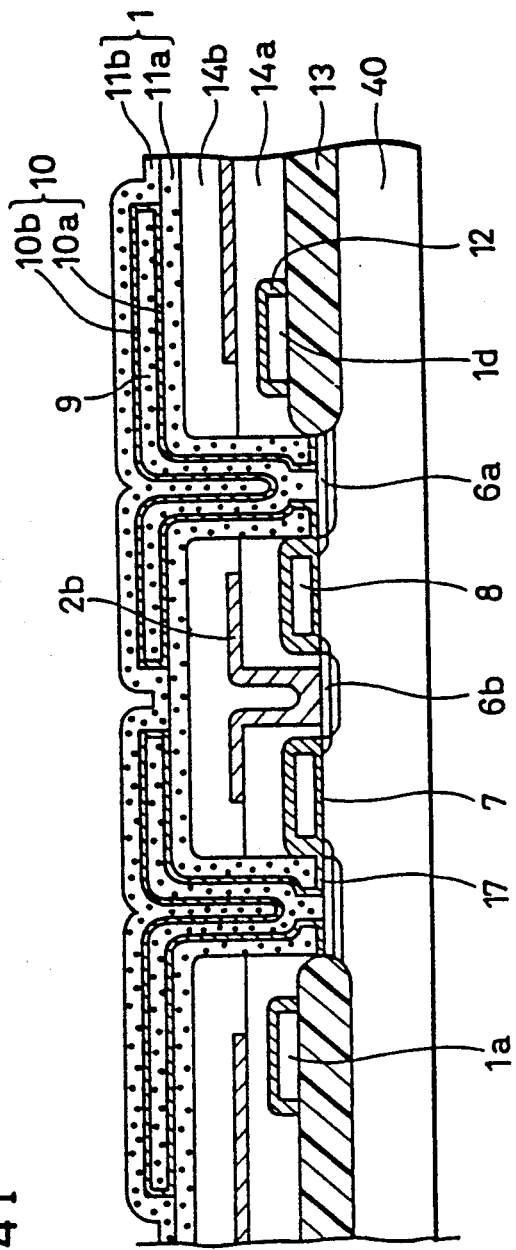

SEMICONDUCTOR MEMORY DEVICE INCLUDING CAPACITOR HAVING STACKED STRUCTURE AND MANUFACTURING METHOD THEREOF

BACKGROUND OF THE INVENTION

1. Field of the Invention

The present invention relates generally to semiconductor memory devices and manufacturing methods thereof and, more particularly, to a dynamic random access memory (hereinafter referred to as DRAM) including a capacitor having stacked structure, a so-called stacked capacitor cell and a method of manufacturing such a DRAM.

2. Description of the Background Art

In recent years, with wider propagation of information apparatus such as computers, semiconductor memory devices have been rapidly in great demand. Further, highly reliable semiconductor memory devices having large memory capacities with respect to function are required. Under such circumstances, technology for fabrication of highly integrated and highly reliable semiconductor memory devices has been developed.

A DRAM is one of the semiconductor memory devices, which enables random input and output of storage information. The DRAM includes in general a memory cell array having a storage region for storing a large amount of storage information and peripheral circuits required for external inputs and outputs.

FIG. 5 is a block diagram showing a general structure of the DRAM. Referring to FIG. 5, a DRAM 50 includes a memory cell array 51, a row and column address buffer 52, a row decoder 53, a column decoder 54, a sense refresh amplifier 55, a data-in buffer 56, a data-out buffer 57 and a clock generator 58. Memory cell array 51 serves to store a data signal as storage information. Row and column address buffer 52 serves to externally receive address signals $A_0$–$A_9$ for selecting a memory cell constituting a unitary storage circuit. Row decoder 53 and column decoder 54 serve to decode the address signals to designate a memory cell. Sense refresh amplifier 55 serves to amplify signals stored in the designated memory cell and to read the amplified signals. Data-in buffer 56 and data-out buffer 57 serve to input and output data. Clock generator 58 generates a clock signal to control for each portion.

Memory cell array 51, occupying a large area on a semiconductor chip, is formed of a plurality of arranged memory cells for storing unitary storage information. FIG. 6 is a diagram showing an equivalent circuit of the memory cells of 4 bits constituting memory cell array 51. Memory cell array 51 includes a plurality of word lines 1a, 1b, 1c and 1d extending in parallel in the direction of rows and a plurality of bit lines 2a and 2b extending in parallel in the direction of columns. Memory cells 3 are formed near the intersections between word lines 1a–1d and bit lines 2a and 2b. Each of memory cells 3 includes one MOS (Metal Oxide Semiconductor) transistor 4 and one capacitor 5. Such a configuration as shown in FIG. 6 that a pair of bit lines 2a and 2b are arranged in parallel to sense refresh amplifier 55 is called a folded bit line system.

A planar arrangement of the DRAM shown in the equivalent circuit diagram of FIG. 6 is shown in FIG. 7. FIG. 7 shows four memory cells including respective sets of MOS transistors Q1, Q2, Q3 and Q4 and capacitors Cs1, Cs2, Cs3 and Cs4 formed in respective operation regions A1, A2, A3 and A4. Gate electrodes constituting transistors Q1–Q4 are formed of portions of word lines 1a–1d corresponding to the respective memory cells. Bit lines 2a and 2b are formed to be insulated from and crossing at right angles to word lines 1a–1d above the word lines. Bit lines 2a and 2b are connected to the memory cells through contact holes C1, C2 and C3.

Next, a cross sectional structure of the memory cells taken along the line VIII—VIII of FIG. 7 is shown in FIG. 8. FIG. 8 shows memory cells 3 of 2 bits. Memory cell 3 includes one MOS transistor 4 and a capacitor 5. MOS transistor 4 includes a pair of source/drain regions 6a and 6b formed to be spaced apart from each other in a surface of a silicon substrate 40, and gate electrodes 8 (1b, 1c) formed on the surface of silicon substrate 40 with a gate oxide film 7 sandwiched therebetween. Capacitor 5 includes a lower electrode (a storage node) 9 connected to one of the source/drain regions 6a of MOS transistor 4, a dielectric layer 10 formed on an upper surface of lower electrode 9, and an upper electrode (a cell plate) 11 covering an upper surface of dielectric layer 10. Lower electrode 9 and upper electrode 11 are formed such as of polysilicon. The capacitor having the above-described stacked structure is called a stacked capacitor. Stacked capacitor 5 has a portion thereof extending over gate electrodes 8 with an insulator film 12 sandwiched therebetween and the other portions thereof extending over a field oxide film 13. A thick interlayer insulation film 14 covers the surface of silicon substrate 40 where capacitor 5 and the like are formed. Bit line 2b formed on interlayer insulation film 14 is connected to the other source/drain region 6b of MOS transistor 4 through a contact hole 15.

In general, the capacitance of capacitor 3 is proportional to a counter area between lower electrode 9 and upper electrode 11 opposing to each other with dielectric layer 10 therebetween. Thus, this counter area should be increased in order to increase the capacitance of capacitor 3. However, the elementary structure of a DRAM has become more miniaturized. A method in which a planar occupied area is reduced for higher integration has been adopted as to memory cell structure. Accordingly, the planar occupied area of a capacitor has been limited and reduced. A decrease in counter area between the electrodes of capacitor 5 causes a decrease in capacitance of the capacitor, resulting in the following problems.

(i) When the capacitance of capacitor 5 decreases, the magnitude of read signals from capacitor 5 decreases. Accordingly, the sensitivity of a storage signal decreases, and the reliability of the DRAM also decreases.

(ii) Erroneous operations are liable to occur due to occurrence of soft errors caused by α-ray.

As described above, the decrease in capacitance of the capacitor causes a degradation in essential function of the DRAM, leading to significant problems.

To eliminate the foregoing disadvantages, a DRAM having such capacitor structure that the reduction in planer occupied area of the capacitor does not cause the decrease in capacitance of the capacitor is proposed. FIG. 9 is a partial cross sectional view showing the structure of a stacked capacitor proposed in, e.g., IEDM (International Electron Devices Meeting) 88, pp. 596–599. In this structure, a capacitor is formed on a bit line. Referring to FIG. 9, gate electrodes 101b and 101c serving also as word lines are formed to be spaced apart from each other on a silicon substrate 140 with a gate oxide film 107 sandwiched therebetween. Source/drain regions 106a and 106b spaced apart from each other by gate electrode 101c are formed in silicon substrate 140. A bit line 102b is formed to be connected with source/drain region 106b. Bit line 102b is formed above word lines 101b and 101c with an insulator film 112 therebetween. A storage node 109 is formed on bit line 102b with an insulator film 114 therebetween. Storage node 109 is formed to electrically come into contact with source/drain region 106a. A cell plate 111 is formed to oppose to storage node 109 with a dielectric film 110 sandwiched therebetween. In this manner, bit line 102b is formed in the lower layer of storage node 109 as a capacitor and cell plate 111. This enables storage node 109 and cell plate 111 to be formed so that bit line 102b may extend over a contact portion connected to source/drain region 106b. This makes it possible to increase the counter area between the two electrodes constituting the capacitor and thus to increase the capacitance of the capacitor.

Such structure that the capacitance of the capacitor is further increased in the stacked capacitor shown in FIG. 9 has been proposed. FIG. 10 is a partial cross sectional view showing the structure of a stacked capacitor proposed in IEDM 88, pp. 592-595. Referring to FIG. 10, gate electrodes 201b and 201c serving also as word lines are formed to be spaced apart from each other on a silicon substrate 240 with a gate oxide film 207 sandwiched therebetween. Source/drain regions 206a and 206b spaced apart from each other by gate electrode 201c are formed in silicon substrate 240. A bit line 202b is formed to be connected with source/drain region 206b. An insulator film 212 is formed between bit line 202b and word lines 201b and 201c. A storage node 209 is formed on bit line 202b with an insulator film 214 sandwiched therebetween. This storage node 209 has a so-called fin structure in which a lower portion thereof is formed to electrically come into contact with source/drain region 206a, and an upper portion thereof is branched to require a larger surface area. A dielectric film 210 is formed to cover the surface of the branched fins of storage node 209. A cell plate 211 is formed to oppose to the surface of the branched fins of storage node 209 with dielectric film 209 interposed therebetween. Branching the upper portion of storage node 209 and then surrounding the surface of the branched fins of storage node 209 by cell plate 211 as described above causes an increase in counter area between the two electrodes constituting a capacitor, thereby to increase the capacitance of the capacitor.

In this capacitor structure, however, the upper portion of the storage node is required to be forked into a number of branches. It is thus anticipated that the manufacture of the branched storage node causes a complication in the manufacture process, leading to a significant degradation of production yield with respect to mass production. Moreover, according to this structure, the cell plate of a top layer can be formed to extend to bottom portions of the storage node formed in electrical contact with the source/drain region; however, it is difficult to form the cell plate located beneath the storage node so as to extend to the roots of the storage node.

SUMMARY OF THE INVENTION

One object of the present invention is to increase capacitance of a capacitor in a semiconductor memory device having a stacked capacitor.

Another object of the present invention is to form a capacitor structure in which a reduction in planar occupied area of a capacitor does not cause a decrease in capacitance of the capacitor, in a semiconductor memory device having a stacked capacitor.

A further object of the present invention is to form a capacitor structure having increased capacitance in a DRAM having a stacked capacitor above a bit line.

A still further object of the present invention is to manufacture a capacitor structure having increased capacitance by combinations of simple manufacture processes without a degradation in production yield with respect to mass production, in a semiconductor memory device having a stacked capacitor.

A semiconductor memory device having a capacitor of a stacked structure according to the present invention includes a pair of impurity regions, a gate electrode, an interconnection layer, an insulator layer, a first conductor layer, a first dielectric layer, a second conductor layer, a second dielectric layer, and a third conductor layer. A first electrode including the first and third conductor layers and a second electrode including the second conductor layer constitute a capacitor. A semiconductor substrate has a main surface and is of a first conductivity type. The pair of impurity regions are second conductivity type regions formed to be spaced apart from each other in the semiconductor substrate. The gate electrode is formed on the semiconductor substrate located between the pair of impurity regions with an insulator film sandwiched therebetween. The interconnection layer is formed to be insulated above the gate electrode so as to be in electrical contact with one of the impurity regions. The insulator layer has a hole having a bottom surface exposing a surface of the other impurity region and a side surface extending approximately vertical to the main surface of the semiconductor substrate and is formed to cover the interconnection layer. The first conductor layer is formed on the insulator layer to extend from the bottom surface of the hole to the side surface thereof and is insulated from the semiconductor substrate. The first dielectric layer is formed on a surface of the first conductor layer. The second conductor layer is formed on a surface of the first dielectric layer and has a portion thereof made in electrical contact with the other impurity region through the hole. The second dielectric layer is formed on a surface of the second conductor layer and has a portion thereof connected with the first dielectric layer. The third conductor layer is formed on a surface of the second dielectric layer and has a portion thereof electrically connected with the first conductor layer.

According to another aspect of the present invention, in a semiconductor memory device having a substrate with an impurity region at a major surface thereof and a substantially planar thick insulation layer on the substrate parallel to the major surface, the insulation layer having a hole therethrough above the impurity region and defining sidewalls in the insulation layer, a stacked capacitor comprises three parallel conductive layers. The three parallel conductive layers are separated from each other by two thin dielectric layers and located on the insulation layer to form a composite capacitor structure. The composite capacitor structure comprises a first and second conductive layers. The first conductive layer extends along an upper surface of the insulation layer between ends located on opposite sides of the hole. The second conductive layer extends through the hole between the upper surface of the insulation layer and the impurity region. First and second outer ones of the conductive layers are connected to each other at each of the ends. One of the first and second conductive layers is formed along the sidewalls and separated from the impurity region at the major surface by a thin insulation film. A third conductive layer is in electrical contact with the impurity region at the major surface.

A manufacturing method of a semiconductor memory device according to the present invention includes the following steps:

(a) forming gate electrodes with a spacing from each other on a main surface of a first conductivity type semiconductor substrate with an insulator film sandwiched therebetween;

(b) forming a pair of impurity regions having a second conductivity type to be spaced apart from each other by the gate electrode;

(c) forming an interconnection layer to be insulated above the gate electrode so as to electrically come into contact with one of the impurity regions;

(d) forming an insulator layer including a hole having a bottom surface exposing a surface of the other impurity region and a side surface extending approximately vertical to the main surface of the semiconductor substrate so as to cover the interconnection layer;

(e) forming a first conductor layer on the insulator layer to extend from the bottom surface to the side surface of the hole and to be insulated from the semiconductor substrate;

(f) forming a first dialectic layer on a surface of the first conductor layer;

(g) forming a second conductor layer on a surface of the first dielectric layer so that a portion of the second conductor layer may electrically come into contact with the other impurity region through the hole;

(h) forming a second dielectric layer on a surface of the second conductor layer so that a portion of the second dielectric layer may be connected with the first dielectric layer; and (i) forming a third conductor layer on a surface of the second dielectric layer so that a portion of the third conductor layer may be electrically connected with the first conductor layer.

According to a preferred embodiment of the present invention, a dynamic random access memory having a capacitor of stacked structure includes a plurality of word lines and bit lines and a plurality of memory cells. The plurality of word lines are formed on a main surface of a semiconductor substrate and extend in a first direction. The plurality of bit lines are formed on the word lines and extend in a second direction crossing the first direction. The plurality of memory cells are provided at the intersections of the word lines and bit lines. Each of the memory cells includes a field effect transistor and a capacitor. The field effect transistor has a pair of impurity regions and a gate electrode connected in a line to the word line. The bit lines are formed to be insulated above the gate electrode so as to electrically come into contact with one of the impurity regions. The capacitor includes a storage node and a cell plate. The storage node is formed of a second conductor layer, and the cell plate is formed of a first conductor layer and a third conductor layer.

In accordance with the present invention, the second conductor layer constituting a first electrode of a capacitor and the first and third conductor layers constituting a second electrode have stacked structure. A first dielectric layer and a second dielectric layer are formed between opposing surfaces of the second and first conductor layers and between those of the second and third conductor layers, respectively. Partly connecting the first and second dielectric layers constitutes a solid dielectric layer, and partly connecting the first and third conductor layers constitutes a solid second electrode. Thus, effective capacitance portions in a capacitor becomes opposing portions between the united first and third conductor layers and the second conductor layer interposed between the first and third conductor layers.

The first conductor layer constituting the second electrode is formed to extend from a bottom surface of a hole formed in an insulator layer to and along a side surface of the hole extending approximately vertical to the main surface of the semiconductor substrate. Accordingly, the first and third conductor layers formed thereon are formed to extend over the side surface of the hole in the insulator layer. This enables respective counter areas, in which the respective first and third conductor layers oppose to the second conductor layer, to be increased in proportion to the thickness of the insulator layer. This enables an increase in the counter area between the first and second electrodes without a surface area of the first electrode increased due to a complicated shape thereof. Since the stacked structure of the capacitor according to the present invention does not have a complicated form, the structure can be manufactured by combinations of simple manufacture processes. This makes it possible to provide a stacked capacitor highly implementable with respect to mass production.

As described above, according to the present invention, since the capacitor of the semiconductor memory device is formed of the stacked structure in which the first electrode, extending from the bottom surface of the hole formed in the insulator layer to and along the side surface of the hole, is interposed between the double layer of the second electrode, the capacitance of the capacitor can be increased. In addition, the increase in capacitance of the capacitor is achieved merely by increasing the thickness of the insulator layer. Thus, a first electrode having a complicated surface shape need not be formed. The combinations of simple manufacture processes facilitate the manufacture of the capacitor of the stacked structure having increased capacitance with respect to mass production.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A, 4B, 4C, 4D, 4E, 4F, 4G, 4H and 4I are partial cross sectional views showing a manufacture method of a memory cell shown in FIG. 3 in the order of processing steps;

DESCRIPTION OF THE PREFERRED EMBODIMENTS

One embodiment of the present invention will now be described with reference to the figures.

Figure 1:
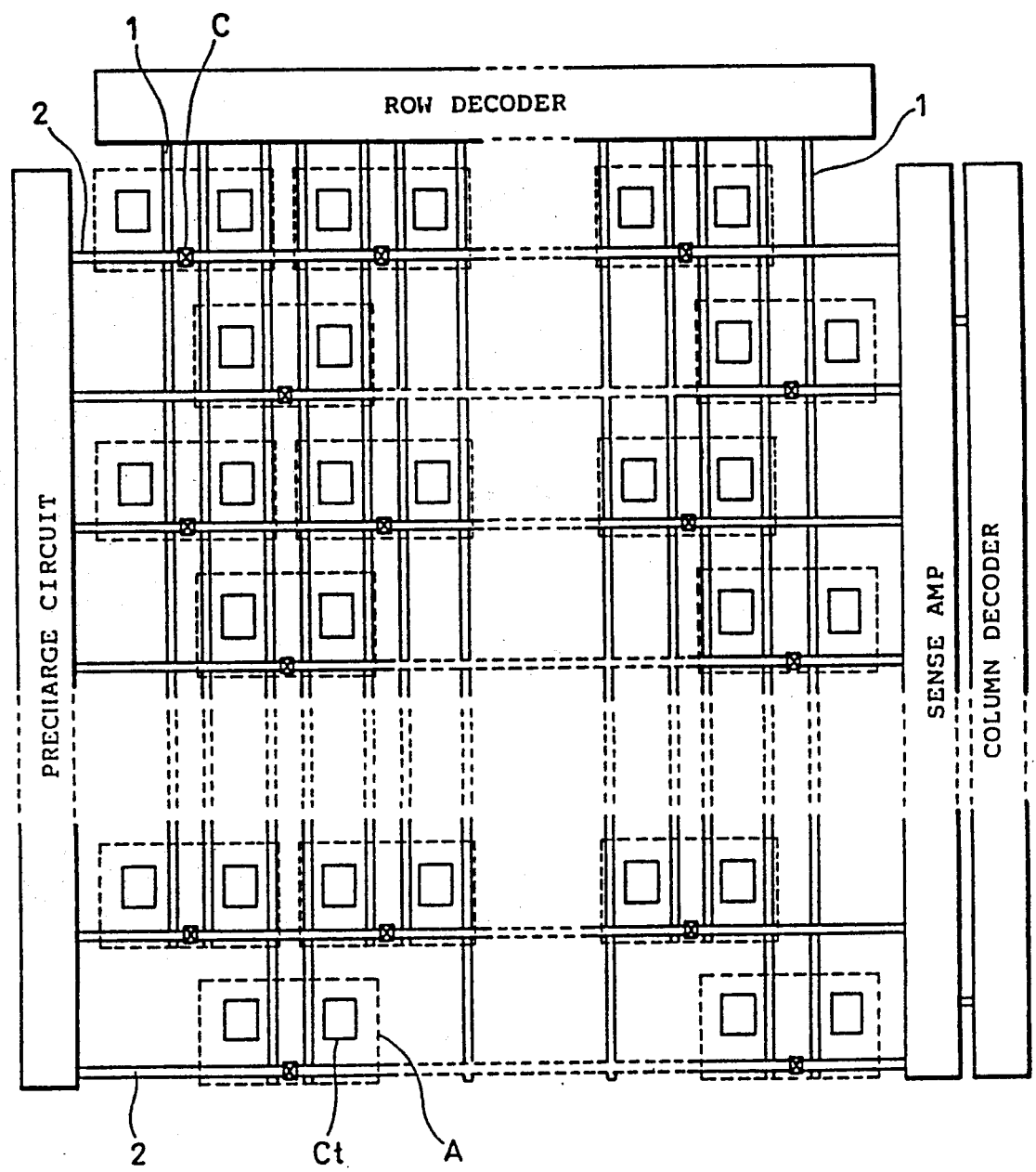
FIG. 1 is a plan view showing arrangement of memory cells of a DRAM according to one embodiment of the present invention.

FIG. 1 shows the arrangement of memory cells of a folded bit line system. A plurality of word lines 1 extend in parallel from a row decoder. A plurality of bit lines 2 connected to a precharge circuit and a sense amplifier extend in parallel with each other crossing word lines 1. Operation regions A are formed near the intersections between word lines 1 and bit lines 2. Bit lines 2 are connected to operation regions A of the respective memory cells through contact holes C. One operation region A includes memory cells of 2 bits, and capacitor contact holes Ct are formed corresponding to the respective memory cells.

Figure 2:
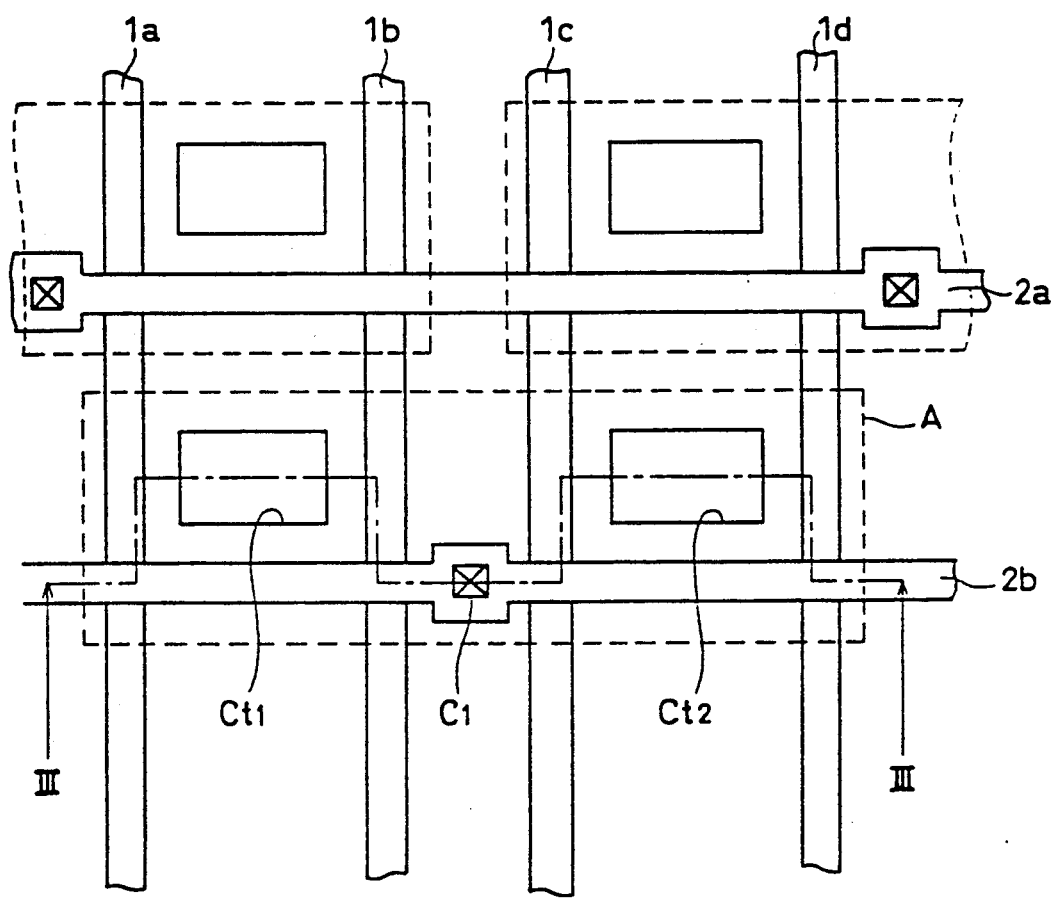
FIG. 2 is an enlarged plan view showing a part of FIG. 1.

Referring to FIG. 2, word lines 1b and 1c are formed extending on operation regions A. Capacitor contact holes Ct1 and Ct2 are formed on the opposite sides of word lines 1b and 1c. A bit line 2b extends in a direction in which the bit line crosses at right angles to word lines 1b and 1c and is connected to operation region A through a contact hole C1.

Figures 3A, 3B:
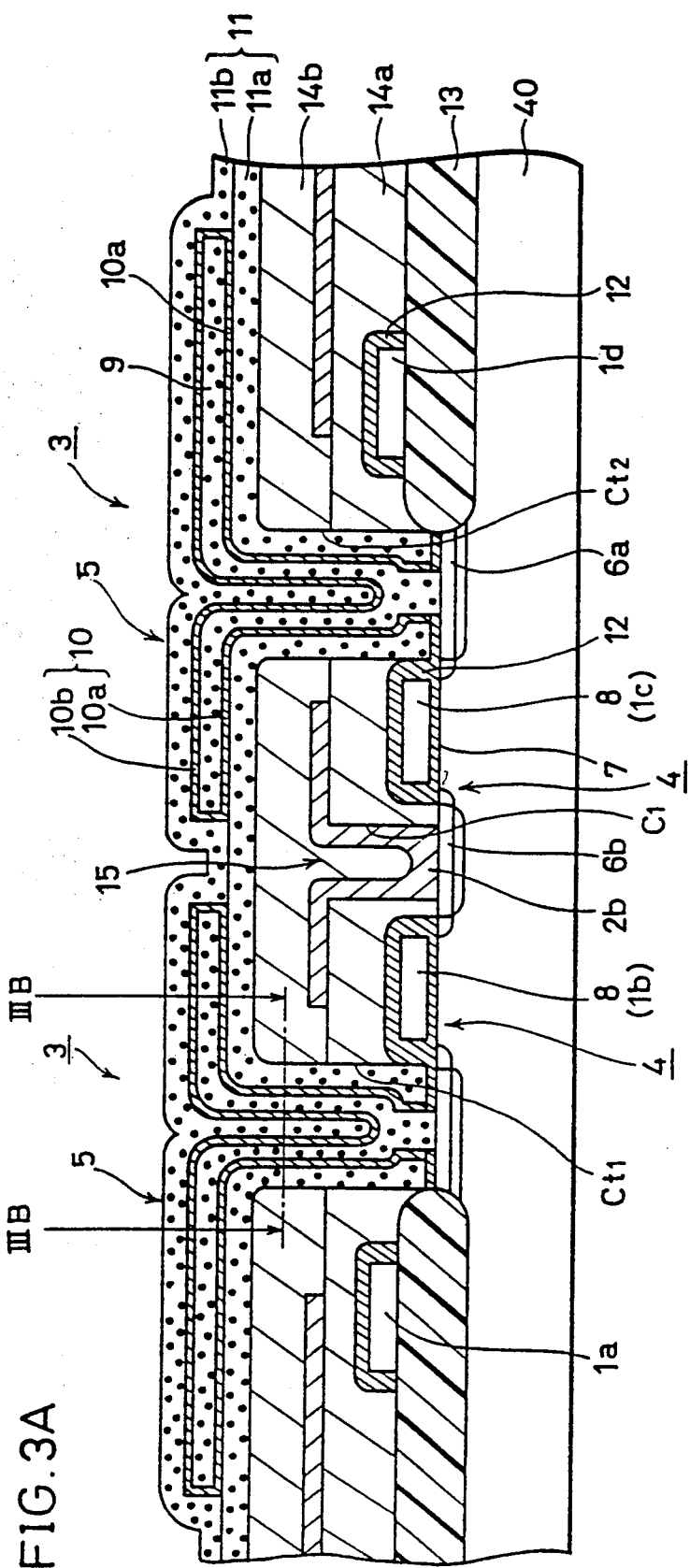
FIG. 3A is a partial cross sectional view showing a cross section taken along the line III—III of FIG. 2.
FIG. 3B is a partial cross sectional view showing a cross section taken along the line IIIB—IIIB of FIG. 3A.

FIG. 3A shows the memory cells of 2 bits. Referring to FIG. 3A, a memory cell 3 includes a MOS transistor 4 and a capacitor 5. MOS transistor 4 includes a pair of source/drain regions 6a and 6b formed with a spacing from each other in a surface of a p type silicon substrate 40, and gate electrodes 8 (word lines 1b and 1c) each formed on the surface of silicon substrate 40 located between source/drain regions 6a and 6b with a gate oxide film 7 sandwiched therebetween. Capacitor 5 includes a lower electrode (storage node) 9 and an upper electrode (cell plate) 11 formed of two layers stacked so as to sandwich lower electrode 9 therebetween. A dielectric layer 10 is formed between opposing surfaces of lower electrode 9 and upper electrode 11. A portion of lower electrode 9 is connected with one source/drain region 6a of MOS transistor 4. Dielectric layer 10 covers a surface region of lower electrode 9 except for this region connected to source/drain region 6a. A lower layer 11a and an upper layer 11b of upper electrode 11 are connected with each other above bit line 2b so as to completely cover a surface region of dielectric layer 10.

As described above, capacitor 5 according to this embodiment has a triple-layer structure in which upper layer 11b and lower layer 11a of upper electrode 11 are stacked with lower electrode 9 interposed therebetween as an intermediate layer. In capacitor 5 having such triplelayer structure, regions occupied on the upper surface, the lower surface and the side surface of lower electrode 9 and opposite to upper electrode 11 serve as capacitor regions. Accordingly, the counter area of these regions has a capacitance portion increased compared to a conventional stacked capacitor having only a double layer structure. In addition, a planar occupied area on the surface of silicon substrate 40 is not particularly increased compared to the conventional structure.

Further, capacitor 5 is formed above bit line 2b with an interlayer insulation film 14b having a thickness of approximately 1 μm or more sandwiched therebetween. Thus, the counter area between lower electrode 9 and upper and lower layers 11b and 11a of upper electrode 11 becomes increased as the thickness of interlayer insulation film 14b becomes increased. As shown in FIGS. 3A and 3B, lower electrode 9 is overlapped on upper and lower layers 11b and 11a of upper electrode 11 so as to extend longitudinally in capacitor contact hole Ct 1. Therefore, when the thickness of the interlayer insulation film is increased so as to make a surface area of lower electrode 9 larger without complicating the form of the surface area, the counter area between the two electrodes of the capacitor can be increased.

Bit line 2b is formed above gate electrode 8 with an interlayer insulation film 14a sandwiched therebetween. This bit line 2b is connected to the other source/drain region 6b through a contact hole 15.

Reference is now made to FIGS. 4A–4I in describing a method of manufacturing memory cells of the DRAM according to the foregoing embodiment.

Figure 4A:
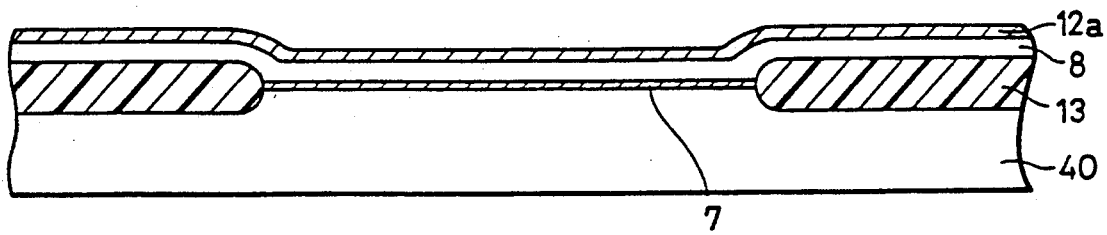

First, with reference to FIG. 4A, field oxide films 13 for isolation are formed with a spacing from each other in a predetermined region on a surface of a p type silicon substrate 40. A silicon oxide film 7 to be a gate oxide film is formed on the surface of silicon substrate 40. A polysilicon layer 8 is formed on a surface of silicon oxide film 7 by employing a CVD (Chemical Vapor Deposition) method. A silicon oxide film 12a for insulation is formed on a surface of polysilicon layer 8.

Figure 4B:
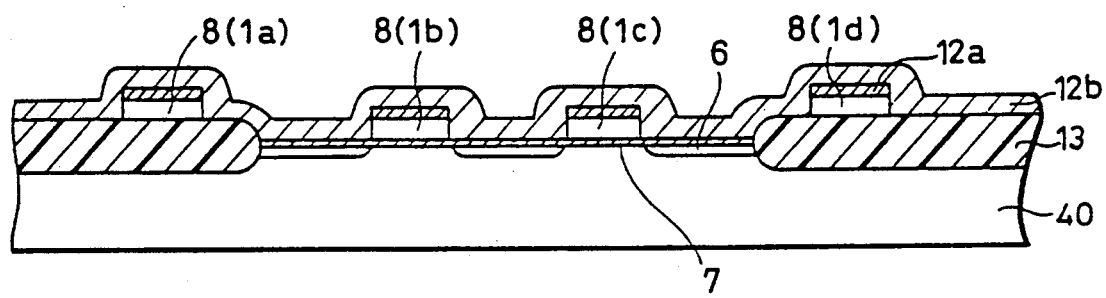

With reference to FIG. 4B, polysilicon layer 8 and silicon oxide film 12a are then patterned in a predetermined form, so as to form gate electrodes 8 (word lines 1a, 1b, 1c and 1d). n type impurities such as arsenic, phosphorus or the like are introduced into silicon substrate 40 with gate electrodes 8 used as mask, thereby to form a source/drain region 6 having low concentration. Further, a silicon oxide film 12b is formed over the entire surface.

Figure 4C:
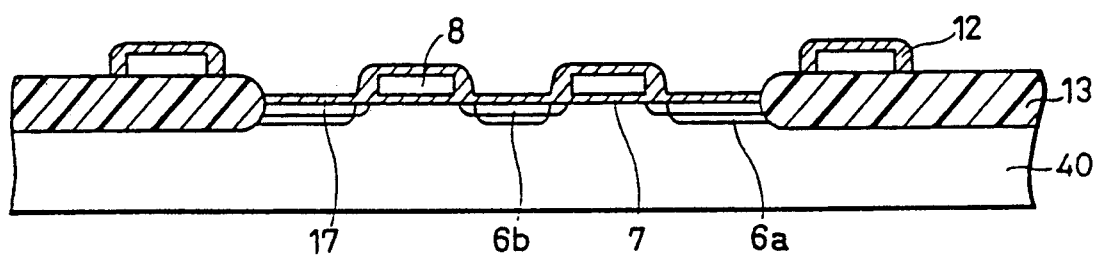

Referring to FIG. 4C, removing silicon oxide film 12b by anisotropical etching causes an insulator film 12 to be formed in a self-aligned manner on an upper surface and a side surface of gate electrode 8. n type impurity ions are implanted onto the surface of silicon substrate 40 with gate electrodes 8 covered with insulator film 12 used as mask, thereby to form an n type impurity region of high concentration. Thus, a pair of source/drain regions 6a and 6b of a MOS transistor 4 are formed. An insulator film 17 is formed on the surface of source/drain regions 6a and 6b.

Figure 4D:
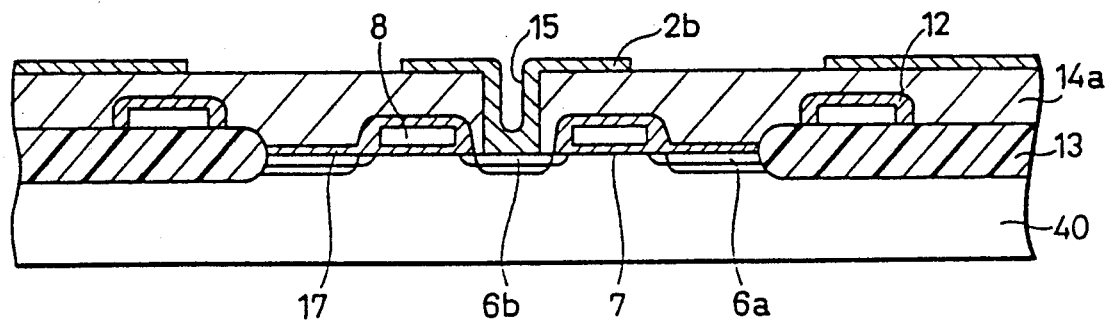

With reference to FIG. 4D, an interlayer insulation film 14a such as of BPSG is formed over the entire surface by the CVD method or the like. Thereafter, a contact hole 15 is formed in this interlayer insulation film 14a by anisotropical etching so as to expose the surface of the other source/drain region 6b. A bit line 2b such as a polysilicon layer is formed to be electrically in contact with the source/drain region 6b through contact hole 15.

Figure 4E:
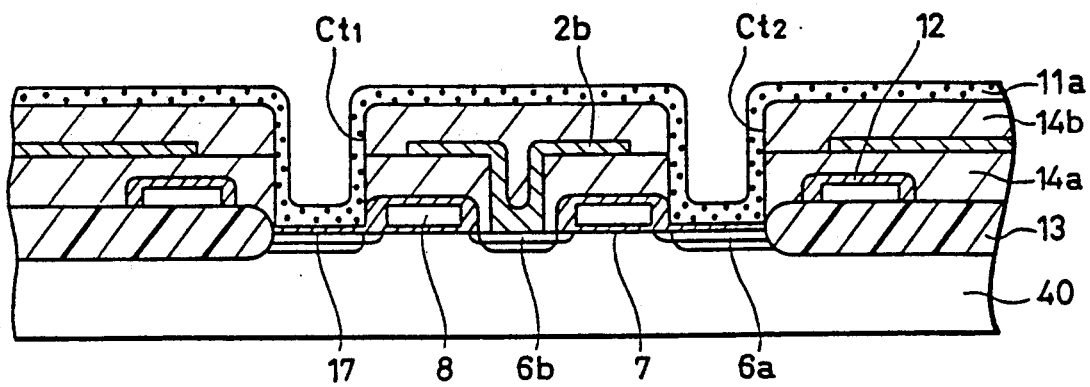

As shown in FIG. 4E, an interlayer insulation film 14b formed such as of SiO₂ is formed in a thickness of, e.g., approximately 1 μm or more by the CVD method or the like. Then, capacitor contact holes Ct1 and Ct2 are formed in interlayer insulation films 14a and 14b by employing anisotropical etching or the like. A silicon oxide film is formed by thermal oxidation or the like on the surface of one source/drain region 6a exposed by capacitor contact holes Ct1 and Ct2. A polysilicon layer 11a is thereafter formed over the entire surface by the CVD method.

Figure 4F:
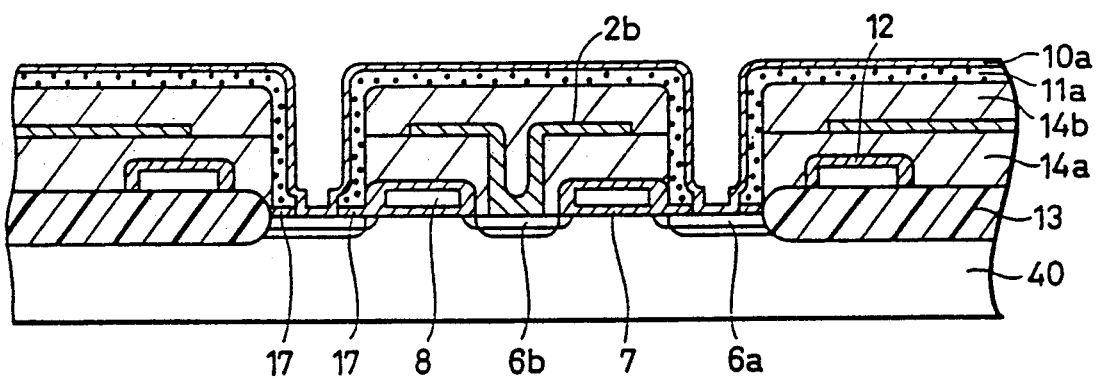

With reference to FIG. 4F, polysilicon layer 11a and insulator film 17 are removed by etching, so that the surface of source/drain region 6a is exposed. This results in formation of a lower layer 11a constituting an upper electrode (cell plate) 11 of a capacitor 5. A silicon nitride film 10a is formed on a surface of lower layer 11a of the upper electrode and on the exposed surface of source/drain region 6a. This silicon nitride film 10a constitutes a portion of a dielectric layer 10 of capacitor 5.

Figure 4G:
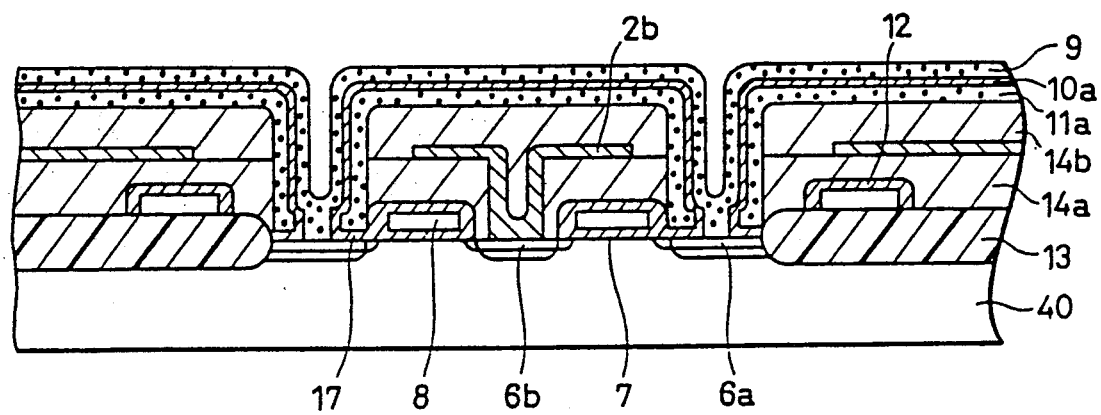
Figure 5:
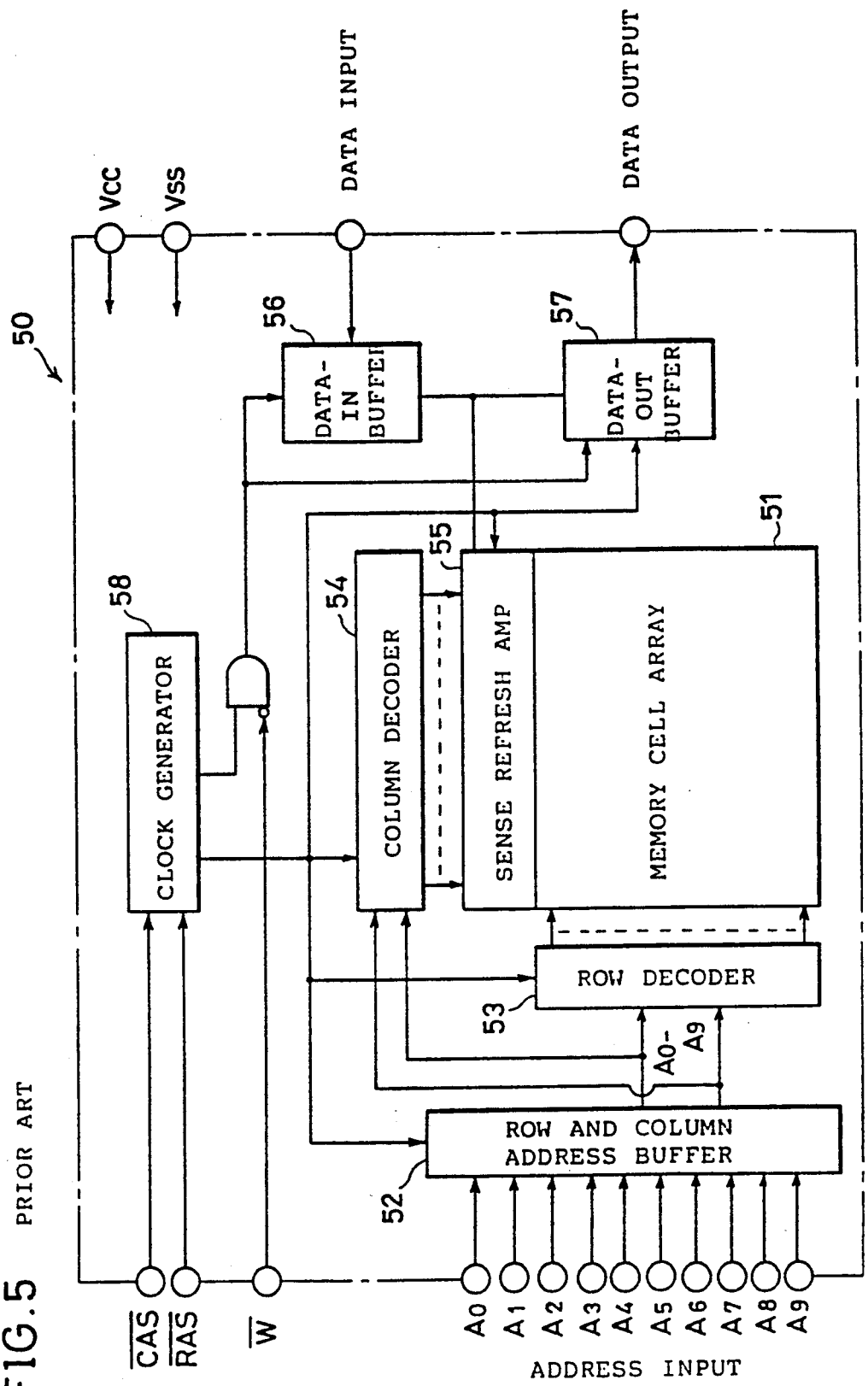
FIG. 5 is a block diagram showing a schematic configuration of a general DRAM.
Figure 6:
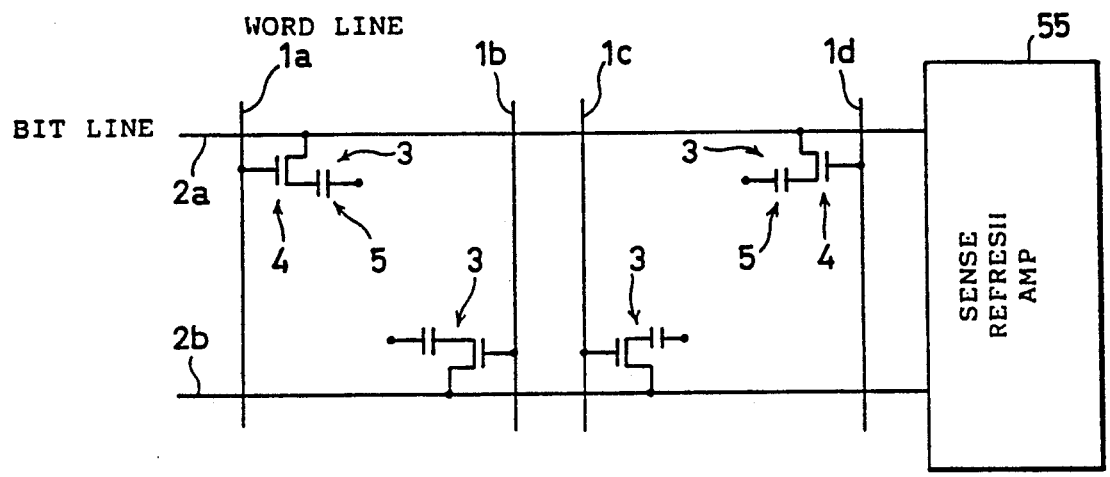
FIG. 6 is an equivalent circuit diagram showing a memory cell structure of 4 bits of the DRAM shown in FIG. 5.
Figure 7:
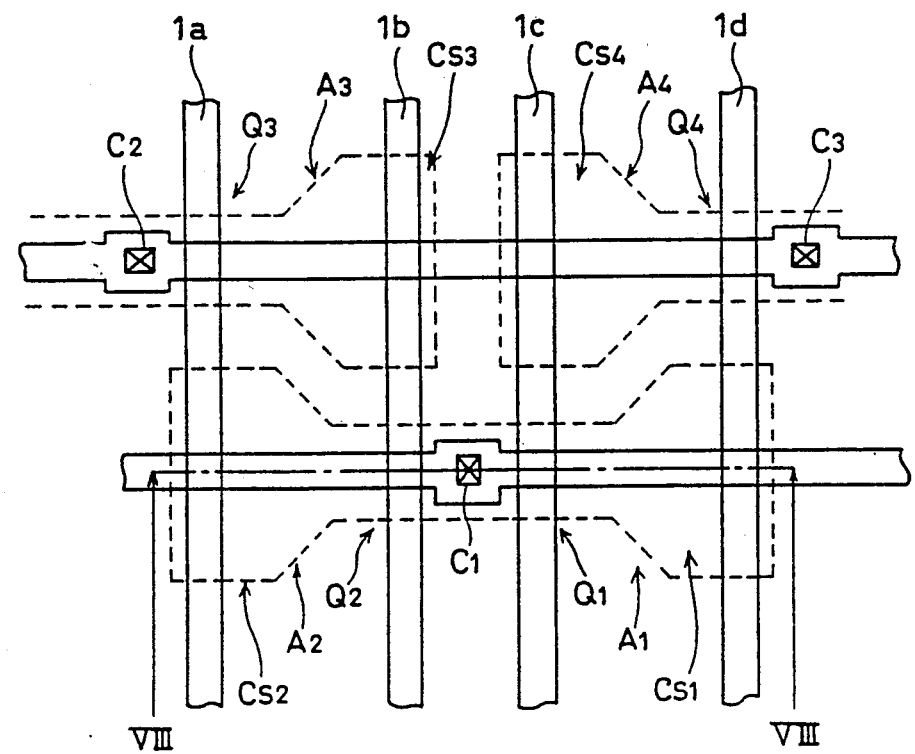
FIG. 7 is a partial plan view showing arrangement of a memory cell array shown in FIG. 6.
Figure 8:
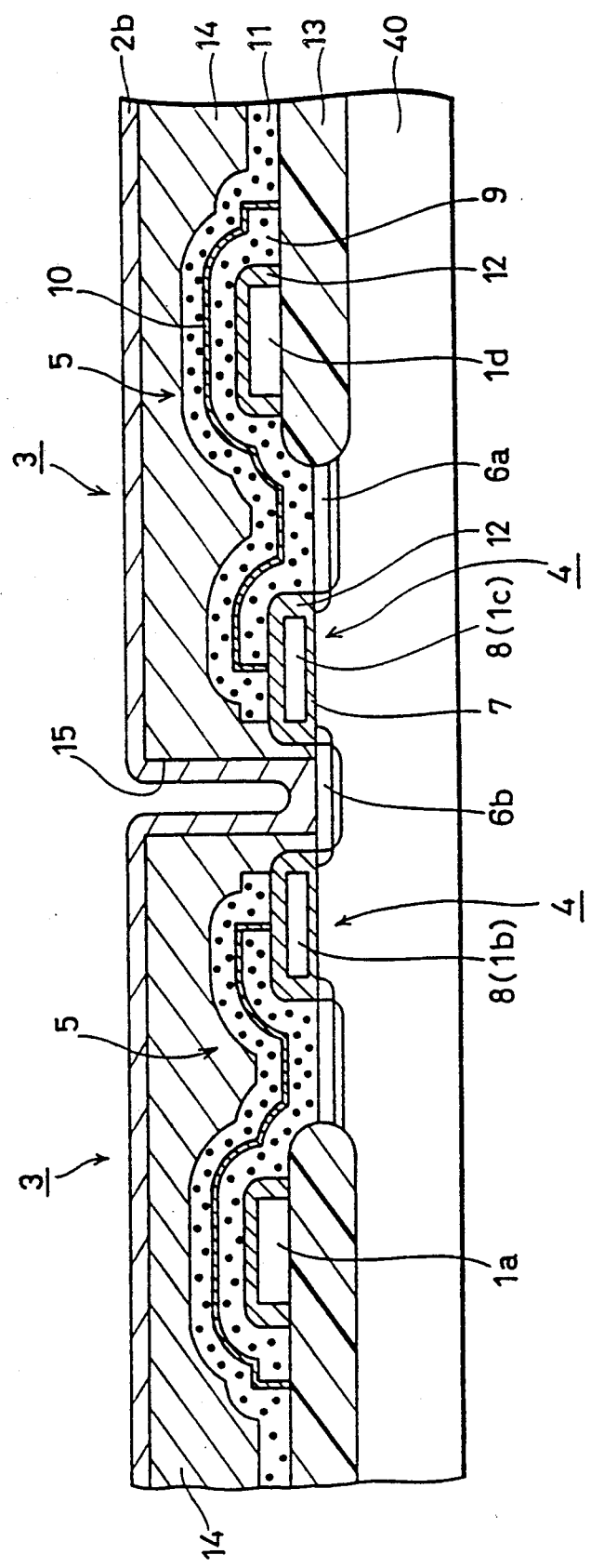
FIG. 8 is a partial cross sectional view showing a cross section taken along the line VIII—VIII of FIG. 7.
Figure 9:
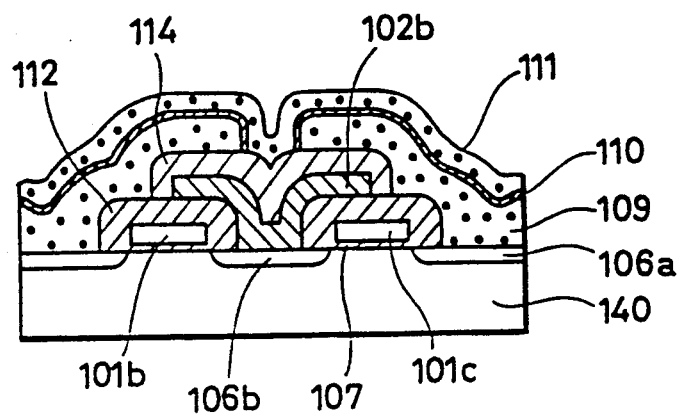
FIG. 9 is a partial cross sectional view showing conventional art of a memory cell structure having a stacked capacitor in which capacitance is increased.
Figure 10:
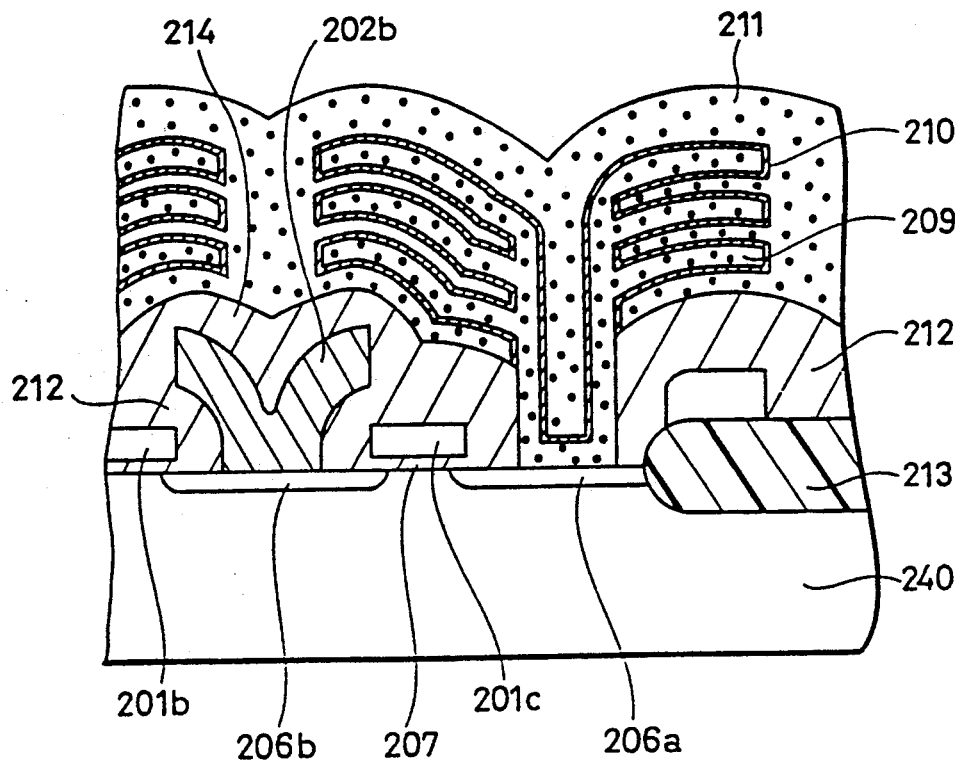
FIG. 10 is a partial cross sectional view showing another conventional art of the memory cell structure having the stacked capacitor in which capacitance is increased.

Then, as shown in FIG. 4G, a portion of silicon nitride film 10a formed on the surface of source/drain region 6a is removed, so as to expose the surface of source/drain region 6a. A polysilicon layer 9 is formed over the entire surface by employing the CVD method.

Referring to FIG. 4H, polysilicon layer 9 is patterned in a predetermined form. The patterned polysilicon layer 9 constitutes a lower electrode (storage node) 9 of capacitor 5. A portion of lower electrode 9 is connected to one source/drain region 6a of MOS transistor 4 through an opening in silicon nitride film 10a. A silicon nitride film 10b is again formed on a surface of lower electrode 9. Accordingly, silicon nitride film 10b is connected to silicon nitride film 10a of the lower layer and is formed to surround the surface of lower electrode 9.

As shown in FIG. 4I, a portion of dielectric layer 10b formed on lower layer 11a of upper electrode 11 is removed, so that the surface of lower layer 11a of upper electrode 11 is partially exposed. In this embodiment, the exposed portion of lower layer 11a is a part of portions extending over gate electrode 8, field oxide film 13, or bit line 2b. Then, a polysilicon layer 11b is formed over the entire surface by employing the CVD method. This polysilicon layer 11b constitutes an upper layer of the upper electrode of capacitor 5.

As mentioned above, according to the present invention, capacitor 5 is formed of a triple-layer structure in which lower electrode (storage node) 9 is interposed between the two upper and lower layers 11a and 11b constituting upper electrode (cell plate) 11. With dielectric layer 10 formed between each of conductor layers 9, 11a and 11b, the counter area between upper electrode 11 and lower electrode 9 becomes increased. This results in formation of capacitor 5 having a large capacitance. This capacitor structure extends along the side surface of the contact hole formed in the interlayer insulation film. Thus, the storage node has a simple cross-sectional shape, and there is no need to adopt complicated manufacture steps in order to increase the counter area between the storage node and the cell plate. Consequently, the structure of the stacked capacitor according to the present invention is highly implementable with respect also to mass production.

As has been described heretofore, according to the present invention, since the capacitor of the semiconductor memory device is formed of the stacked structure in which the first electrode extending from the bottom surface to the side surface of the hole formed in the insulator layer is interposed between the two layers of the second electrode, the capacitance of the capacitor can be increased. Moreover, only increasing the thickness of the insulator layer enables an increase in capacitance of the capacitor. Thus, it is unnecessary to form the first electrode having a complicated surface shape, and hence the combinations of the simple manufacture processes facilitate the manufacture of the capacitor of the stacked structure having increased capacitance with respect to mass production.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a capacitor having a stacked structure, comprising:
   a semiconductor substrate of a first conductivity type having a main surface;
   first and second impurity regions of a second conductivity type spaced apart from each other on said semiconductor substrate;
   a gate electrode formed on said semiconductor substrate located between said first and second impurity regions with an insulator film interposed therebetween;
   an interconnection layer formed above said gate electrode so as to electrically contact said first impurity region;
   an insulator layer including a hole exposing a surface of said second impurity region and having a side surface extending approximately vertical to the main surface of said semiconductor substrate, formed to cover said interconnection layer;
   a first conductor layer formed on said insulator layer extending into said hole and insulated from said semiconductor substrate;
   a first dielectric layer formed on a surface of said first conductor layer;
   a second conductor layer formed on a surface of said first dielectric layer and having a portion thereof electrically contacting said second impurity region through said hole;
   a second dielectric layer formed on a surface of said second conductor layer and having a portion thereof connected with said first dielectric layer; and
   a third conductor layer formed on a surface of said second dielectric layer and having a portion thereof electrically connected with said first conductor layer, wherein
   a first electrode including said first conductor layer and said third conductor layer, and a second electrode including said second conductor layer, form plate elements of a capacitor.

2. The semiconductor memory device according to claim 1, wherein
   said first conductor layer is formed on an insulator film formed on a surface of said second impurity region.

3. The semiconductor memory device according to claim 2, wherein
   a portion of said second conductor layer is electrically in contact with said second impurity region through an opening formed in said insulator film so as to expose the surface of said second impurity region.

4. The semiconductor memory device according to claim 1, wherein
said first dielectric layer includes a sidewall formed to extend along the side surface of said hole.

5. The semiconductor memory device according to claim 4, wherein
said second conductor layer includes a sidewall formed to extend along the side surface of said hole.

6. The semiconductor memory device according to claim 5, wherein
said third conductor layer includes a sidewall formed to extend along the side surface of said hole.

7. The semiconductor memory device according to claim 1, wherein
a portion of said second dielectric layer is connected with said first dielectric layer on ends of said second conductor layer extending on said insulator layer.

8. The semiconductor memory device according to claim 1, wherein
a portion of said third conductor layer is connected with said first conductor layer on said insulator layer.

9. A dynamic random access memory including a capacitor having a stacked structure, comprising:
a semiconductor substrate of a first conductivity type having a main surface;
a plurality of word lines formed above said main surface and extending in a first direction;
a plurality of bit lines formed above said word lines and extending in a second direction crossing said first direction; and
a plurality of memory cells provided at intersections between said word lines and said bit lines,
each of said memory cells including a field effect transistor and a capacitor,
said field effect transistor including
first second impurity regions of a second conductivity type spaced apart from each other on said semiconductor substrate, and
a gate electrode formed on said semiconductor substrate between said first and second impurity regions with an insulator film interposed therebetween and connected to one of said plurality of word lines; wherein
said bit lines are formed above said gate electrode so as to electrically contact said first impurity region, and
an insulator layer including a hole exposing a surface of said second impurity region and a side surface extending approximately vertical to the main surface of said semiconductor substrate is formed to cover said bit lines,
said capacitor including
a first conductor layer formed on said insulator layer to extend into said hole and be insulated from said semiconductor substrate,
a first dielectric layer formed on a surface of said first conductor layer,
a second conductor layer formed on said first dielectric layer and having a portion thereof made in electrical contact with said second impurity region through said hole,
a second dielectric layer formed on a surface of said second conductor layer and having a portion thereof connected with said first dielectric layer, and
a third conductor layer formed on a surface of said second dielectric layer and having a portion thereof electrically connected with said first conductor layer, wherein
said second conductor layer constitutes a storage node, and said first and third conductor layers constitute a cell plate.

10. In a semiconductor memory device having a substrate with an impurity region at a major surface thereof and a substantially planar thick insulation layer on said substrate parallel to said major surface, the insulation layer having a hole extending therethrough above said impurity region and defining sidewalls in said insulation layer, a stacked capacitor comprising:
three parallel conductive layers separated from each other by two thin dielectric layers and located on said insulation layer to form a composite capacitor structure, said composite capacitor structure comprising a first conductive layer extending along a portion of an upper surface of said insulation layer surrounding said hole and a second conductive layer extending through said hole;
wherein said first and second conductive layers are connected to each other at said portion of said upper surface, one of said first and second conductive layers is formed along said sidewalls and separated from said impurity region at said major surface by a thin insulation film and a third conductive layer is in electrical contact with said impurity region at the major surface.

11. In a semiconductor memory device having a substrate with an impurity region at a major surface thereof and a substantially planar thick insulation layer on said substrate parallel to said major surface, the insulation layer having a hole extending therethrough above said impurity region and defining sidewalls in said insulation layer, a composite capacitor structure comprising:
first, second and third conductive layers separated from each other by thin dielectric layers and extending through said hole between an upper surface of said insulation layer and said impurity region, a portion of said first conductive layer surrounding a portion of second conductive layer and said portion of said second conductive layer surrounding a portion of said third conductive layer;
wherein said first conductive layer is formed along a sidewall of said hole and separated from said impurity region at said major surface by a thin insulation film, said second conductive layer is in electrical contact with said impurity region at the major surface and said third conductive layer is electrically connected to said first conductive layer.

12. The semiconductor memory device according to claim 11, wherein
said first, second and third conductive layers includes conductive layers formed extending along an upper surface of said insulation layer.

* * * * *

UNITED STATES PATENT AND TRADEMARK OFFICE
CERTIFICATE OF CORRECTION

PATENT NO. : 5,247,196
DATED : September 21, 1993
INVENTOR(S) : Mikihiro KIMURA

It is certified that error appears in the above-indentified patent and that said Letters Patent is hereby corrected as shown below:

On the title page, please delete item [75] and insert therefor:

--[75]   Inventors:   Mikihiro Kimura, Hyogo, Japan--

Signed and Sealed this

Twenty-eighth Day of June, 1994

Attest:

BRUCE LEHMAN

Attesting Officer    Commissioner of Patents and Trademarks